United States Patent

Ohtani

[11] Patent Number: 6,066,982
[45] Date of Patent: May 23, 2000

[54] PHASE LOCKED LOOP APPARATUS FOR PULSE SIGNAL DEMODULATION

[75] Inventor: Yoshihiro Ohtani, Kyoto, Japan

[73] Assignee: Sharp Kabushiki Kaisha, Osaka, Japan

[21] Appl. No.: 09/015,944

[22] Filed: Jan. 30, 1998

[30]        Foreign Application Priority Data

Jan. 31, 1997  [JP]  Japan ..................................... 9-019162

[51] Int. Cl.⁷ ....................................................... H03K 9/04
[52] U.S. Cl. ............................ 329/313; 369/59; 375/239; 375/340
[58] Field of Search ..................................... 375/238, 239, 375/340; 329/313; 369/59; 360/51

[56]             References Cited

FOREIGN PATENT DOCUMENTS 62-109528  7/1987  Japan .

Primary Examiner—Arnold Kinkead

[57]        ABSTRACT

A pulse position modulation pulse signal to be demodulated is sampled by a pulse detection part based on a motion clock. The motion clock is generated from a motion clock generating part so that a period of pulse precision n falls within a width of an information pulse in the signal to be demodulated. A phase relationship between the motion clock and the information pulse to be demodulated is classified into six kinds of patterns, and in case the relationship is outside the patterns, it is to be excluded as being under effect of noise. The pulse detection part gives a pulse detection signal in which the effect of the noise has been eliminated to a phase comparison part, which compares the given signal with a reproduction clock timing signal showing the timing of a reproduction clock signal generated in a clock reproduction part, then generates a control signal for controlling a phase of the clock reproduction part. Consequently, it becomes possible to lower a frequency of the motion clock for detecting a position or phase of the information pulse from the pulse position modulation pulse signal in a phase locked loop circuit.

16 Claims, 14 Drawing Sheets

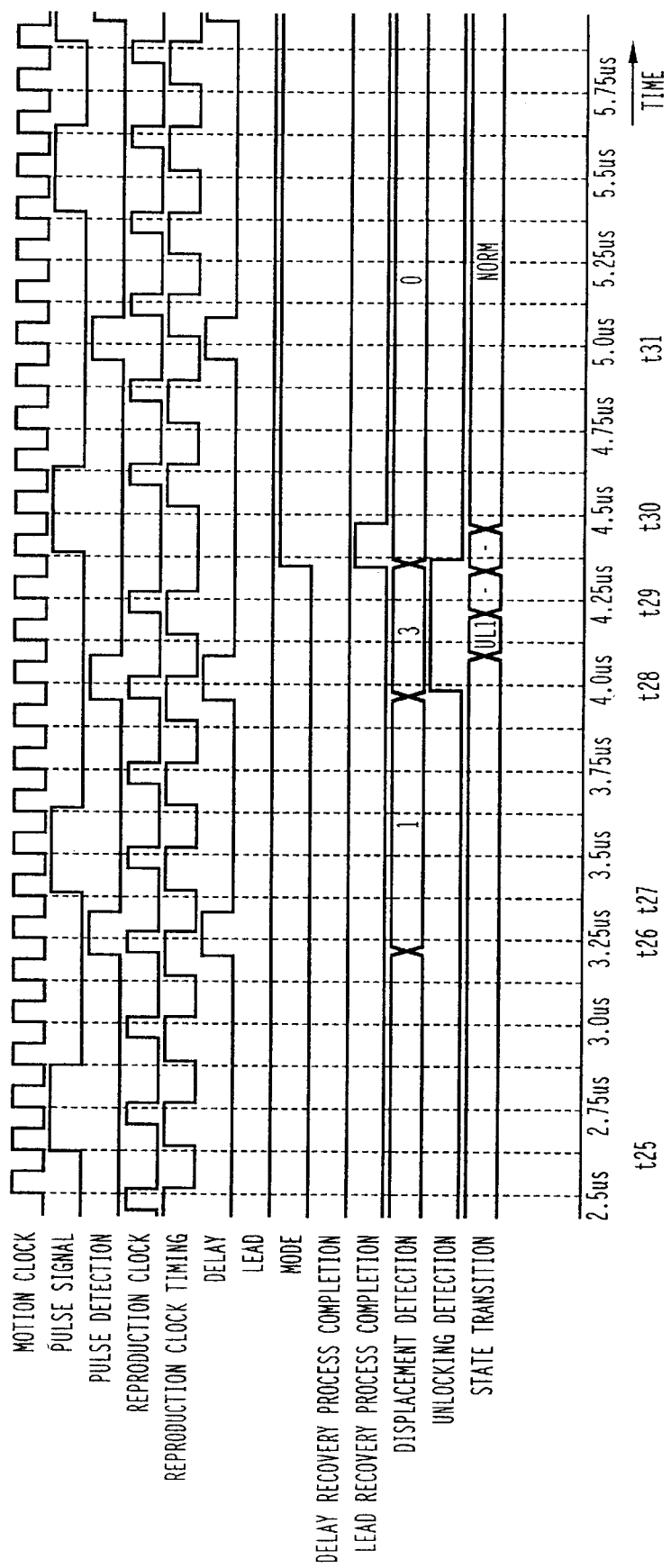

4-PPM

16-PPM

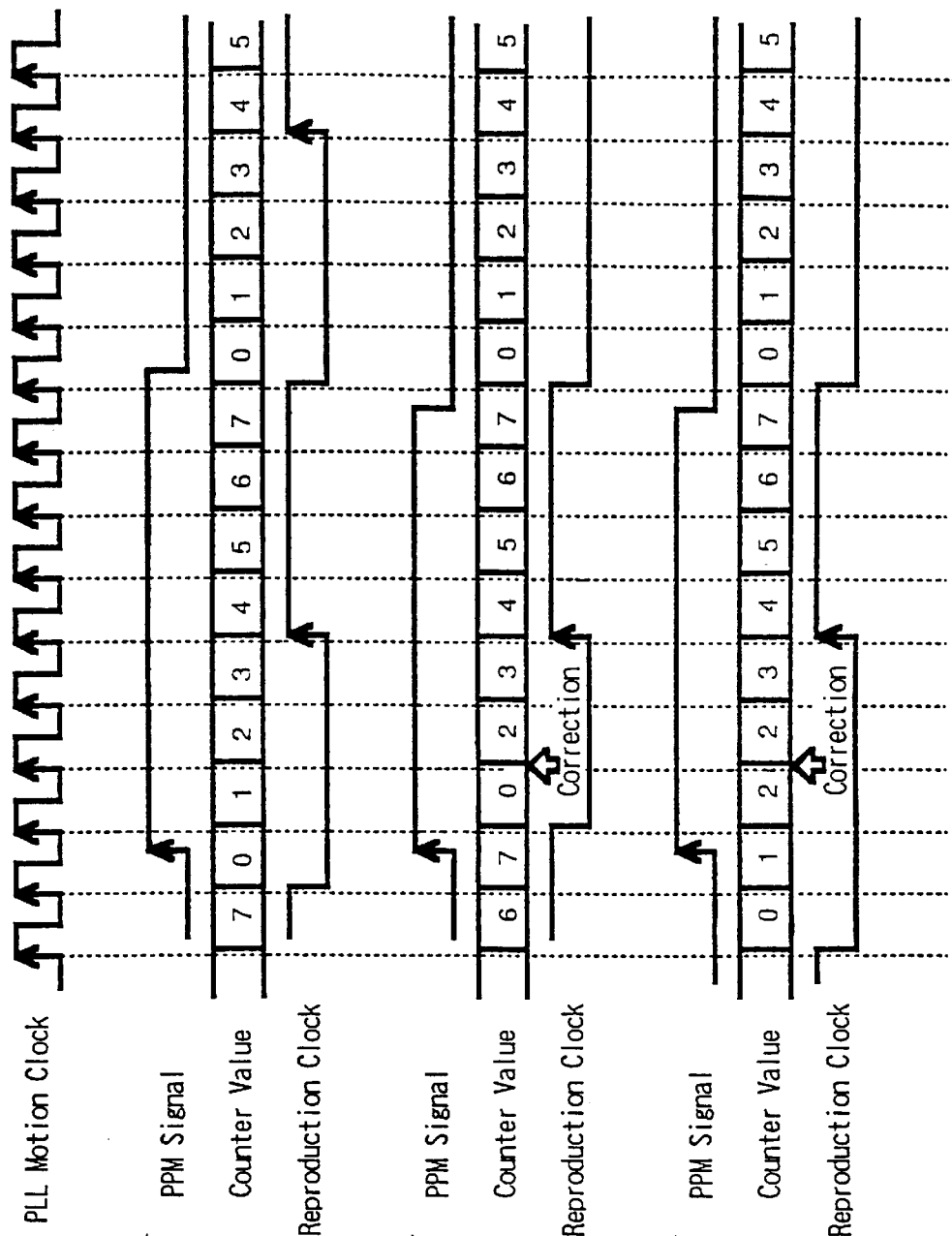
FIG. 13A Phases Agreeing Condition
FIG. 13B Counter Delayed Condition
FIG. 13C Counter Leading Condition

PHASE LOCKED LOOP APPARATUS FOR PULSE SIGNAL DEMODULATION

BACKGROUND OF THE INVENTION

1. Field of the Invention

The present invention relates to a PLL (Phase Locked Loop) apparatus for demodulating pulse signals having an information carrying pulse of a constant pulse width such as PPM (pulse-phase- or pulse-position-modulated) signals.

2. Description of Background Art

PPM called pulse-phase-modulation or pulse-position-modulation has been extensively used in the field of optical communication utilizing infrared rays or the like. The PPM is a manner to transmit information according to a pulse position of an information pulse in each cycle of a pulse signal having a certain period. Generally, for convenience, 4-PPM, 16-PPM and the like are preferably used.

FIGS. 11A and 11B show a basic concept of the PPM. FIG. 11A shows a modulation waveform on 4-PPM, and FIG. 11B a modulation waveform on 16-PPM. In this specification, it is assumed that a bit of a signal takes on one of two logical values "0" and "1". Herein, taking an example of a 4-PPM modulation system shown in FIG. 11A, explanation will be given in detail. According to the 4-PPM modulation system, information is transmitted by 2 bits, not by 1 bit. Conceivable combinations of 2 bit information are four kinds of "00", "01", "10", and "11". In these four kinds, phases or positions in which pulses exist are different. The information pulse exists in any of the four positions called pulse slots provided by dividing one period of the pulse signal into four parts. In the 16-PPM shown in FIG. 11B, one period of the pulse signal is divided into 16 parts and 16 pulse slots are obtained.

FIG. 12 shows a constitution for demodulating the PPM modulation waveform. The PPM demodulating apparatus comprises a PLL part 1 and a PPM demodulation part 2. The PLL part 1 takes out timing necessary for demodulation from a received PPM signal and gives it to the PPM demodulation part 2 as a reproduction clock signal.

In the PPM demodulation part 2, there are following methods practiced in general: an integration discharge filter method for comparing voltages between respective pulse slots by integration and carrying out integration assuming that the pulse exists in the pulse slot which shows a maximum value; a maximum voltage detection method for simply performing a sampling at a certain spot in each pulse slot to detect the pulse slot which shows a maximum value, instead of carrying out the integration. However, in case of carrying out demodulation by using these methods, a reproduction clock signal having a relatively high precision to the pulse slot is required. The PLL part 1 generates the reproduction clock signal necessary for reproduction in the PPM demodulation part 2. With respect to realization of the PLL part 1, there is a system which includes an analog circuit only, a system which includes a digital circuit only, a system which includes a mixture of an analog circuit and a digital circuit, and the like, of which the system which includes the digital circuit only is the easiest circuit to realize. In case of realizing the PLL part 1 with the digital circuit only, the part 1 has a phase comparison part 3 and a counter part 4. A prior art digital system PLL circuit is disclosed, for example, in Japanese Unexamined Utility Model Publication JP-U 62-109528 (1987).

FIGS. 13A through 13C show operational principles in case the PLL part 1 of FIG. 12 is realized by a digital circuit. A PLL motion clock is provided by an external part of the PPM demodulating apparatus. FIG. 13A shows a condition in which a PPM signal to be received and a change in counter value of the counter part 4 match in phase with each other. When the counter value of the counter part 4 is sampled on the rising edge of the PPM signal, it is shown as exactly zero, and this condition is to be called "matching in phase" between the PPM signal and the counter value. The phase comparison part 3 of FIG. 12 inspects whether the PPM signal and the counter value match in phase with each other.

The phase comparison part 3 does not exercise any control when the two phases match with each other, but in case they do not match, it gives a correction signal to the counter part 4 so as to bring the phases to matching. FIG. 13B shows how the counter part 4 is corrected in case the counter value is delayed against the PPM signal, and FIG. 13C shows how it is corrected in case the counter value is advanced. In other words, in these examples the counter part 4 continues to count up unless it is given the correction signal by the phase comparison part 3. In case the counter value is delayed against the PPM signal, counting up is made only once for two parts, and on the contrary in case the counter part 4 is advanced, the counting up is stopped only once. By exercising such control, the phase of the counter is to be made to match with the PPM signal at all times.

On the other hand, the reproduction clock signal is formed from an output of the counter part 4. In FIGS. 13A through 13C, a most significant bit of the counter value is the reproduction clock signal. For this reason, the reproduction clock signal rises when the counter value changes from 3 to 4, and it falls when the value changes from 7 to 0. As the control is made so that the PPM signal and the counter value match in phase with each other at all times, in an example shown in FIGS. 13A through 13C, a phase relationship in which the reproduction clock signal rises in a vicinity of a middle point of the pulse of the PPM signal, is obtained.

In a conventional PPM demodulating apparatus shown in FIG. 12, in case of realizing the PLL part 1 with a digital circuit, as shown in FIGS. 13A through 13C, the PLL motion clock having a high frequency in comparison with inputted PPM signal is required. First, when a pulse width of a pulse to be used for PPM is represented as To(s), a frequency of a clock signal in which a time of the pulse width is one period becomes 1/To (Hz). Assuming this frequency to be fo (Hz), it can be seen that the PLL part requires a PLL motion clock having the frequency of $n \times f_o$ (Hz), wherein n shows a number of times for the counter part 4 to count up per pulse slot time. In the examples shown in FIGS. 13A through 13C, n=8. This n is to be referred to simply as "a precision of PLL" hereafter. Further, "PLL with a precision of n" may be defined as "a PLL circuit whose motion clock is a clock having a 1/n of pulse width time of the pulse used for PPM as one period."

The larger a value of the PLL precision n, the more "delicate" phase adjustment becomes possible. Especially, in case of using the aforesaid integration discharge filter method or maximum voltage detection method in the PPM demodulation part 2, there is a possibility even for a slight phase shift to affect performance to a great degree. Therefore, it is necessary to make the value of the PLL precision n large so as to perform delicate phase adjustment.

Also, there is an advantage that the performance against noise can be improved as the value of the precision n is increased. It is possible that various types of noise are mixed into a PPM signal shown in FIG. 12 in a process of communications. If noise is inputted while the counter value indicates an amount other than 0, the phase comparison part 3 corrects the counter value 4 based on the noise, resulting in a shift in the phase of the reproduction clock signal. Though the phase shift caused by the erroneous correction is to be amended when a next pulse of the PPM signal is received, in case the noise is further inputted before the receipt of the next PPM pulse, there is a possibility for the phase shift to spread rapidly. As an amount of the phase to be erroneously corrected on receipt of one noise pulse becomes $2\pi/n$, it is seen that the PLL having the larger value of precision n is less susceptible to an effect of the phase shift against the noise.

As PPM demodulation systems, there are ones in which a sampling per se necessitates a highly precise alignment, such as the above-mentioned integration discharge filter method and maximum voltage detection-method, and ones which do not necessitate so highly precise an alignment. The systems which do not necessitate so highly precise an alignment includes one in which the PPM signal converted to a digital level is sampled by the reproduction clock signal, and it is assumed that a signal existed in the pulse slot showing a sampling result was 1. However, even in such the system, in order to obtain improvement in the noise resistance performance, it is necessary to make the value of the PPL precision n large.

According to the conventional PPM demodulating apparatus, for reasons as stated above, the value of the precision n is made large and kept for example at 8 or more. However, the larger the value of n, the higher electric power consumption of the circuit. In general, in the electronic circuit, when operation is repeated at a high speed, an increase in the power consumption is inevitable due to a change of state. Particularly, in case of constituting a circuit by C-MOS, compared with little power consumption in static operation, the power consumption sharply increases as the frequency of the motion becomes higher.

Assuming a case of carrying out a communication of for example 2 Mbps by 16-PPM, the pulse width becomes 125 ns, and the value of the frequency in which the pulse width is one period becomes fo=8 MHz. Accordingly, when the precision is $n \geq 8$, the motion clock of PLL is 64 MHz or more. Assuming that a device is equipped with such a PPM demodulating apparatus to obtain a motion clock based on a master clock, the device requires a master clock of 64 MHz or more. At present, however, there is a large possibility for the master clock to be lower than 64 MHz, and it is difficult to equip the device having such a low master clock with a PPM demodulating apparatus having a PLL motion clock of 64 MHz or more. Namely, in the conventional digital system PPM demodulation apparatus, because of necessity to make the value of the PLL precision n large under a requirement for the demodulation system and a requirement for the noise resistance performance, there are problems of not only an increase in power consumption but also an increased possibility that the PLL motion clock is not obtained in equipment provided with the PPM demodulating apparatus.

The prior art of Japanese Unexamined Utility Model Publication JP-U 62-109528 (1987) discloses an concept that the frequency of the motion clock necessary for obtaining the reproduction clock signal which falls within the same frequency fluctuation range as heretofore can be reduced to ½. However, the prior art can merely reduce the conventional precision n of 8 to 4.

SUMMARY OF THE INVENTION

An object of the present invention is to provide a PLL apparatus for demodulating a pulse signal in which a reproduction purpose clock signal which matches in phase with a pulse to be demodulated can be easily obtained, even without enlarging a value of a precision n of PLL.

The present invention provides a PLL apparatus for demodulating a pulse signal, which transmits information depending on whether an information pulse having a pulse width within a certain range is present or not, the apparatus periodically generating a reproduction purpose clock signal with a reference pulse width to demodulate the pulse signal and controlling a phase of the reproduction purpose clock signal to detect whether the information pulse is present or not in the pulse signal at a predetermined timing of change in waveform of the reproduction purpose clock signal, the apparatus comprising:

motion clock generating means for generating a motion clock signal having a predetermined period of two or more natural numbers corresponding to the reference pulse width;

pulse detecting means for comparing a result of sampling of the pulse signal to be demodulated on the basis of the motion clock signal from the motion clock generating means with a plurality of patterns expected on the basis of fluctuations in pulse width of the information pulse in the pulse signal and fluctuations in phase of the information pulse in the pulse signal and the motion clock signal, to detect whether the information pulse is present or not, according to presence or absence of any pattern matching with the sampling result;

reproduction clock generating means for generating the reproduction purpose clock signal; and phase comparing means for comparing the phase of the information pulse in the pulse signal which is judged by the pulse detecting means as being present in the pulse signal with that of the reproduction purpose clock signal generated from the reproduction clock generating means, and carrying out phase control of the reproduction clock generating means according to a comparison result.

According to the present invention, the pulse detecting means can sample the pulse signals to be demodulated on the basis of the motion clock and perform highly reliable pulse detection through a comparison between the sampling result and the expected patterns. As a period of the motion clock is a predetermined fraction of the pulse width of the pulse signal to be demodulated by said period, it is anticipated that there is a specified pattern when sampling is made a denominator's number of the fraction of times or more. Accordingly, in case of not matching with any one of expected patterns, it is judged that there is no pulse in the signal to be demodulated, and in case of the presence of the signal matching with one of the patterns, it is judged that there is a pulse. Since the phase comparing means carries out phase control of the reproduction clock generating means when the pulse detecting means has judged that there was a pulse, it is possible to avoid erroneous motion due to noise and have a PLL circuit operate normally even when a frequency of the motion clock is lowered.

According to the invention, the detection of a pulse from the pulse signal can be made under less effect of the noise, and therefore, in a PPM demodulation system which does not specially require phase adjustment with a high precision, it is possible to make a value of a precision n small, i.e., the frequency of the motion clock can be reduced. As the frequency of the motion clock is lowered, power consumption of the PLL demodulation circuit and the like becomes low, and it becomes possible to easily make the motion clock from a master clock of a device to be equipped with the PLL apparatus.

Furthermore, the invention is characterized in that the phase comparing means includes:

comparing means for comparing the phase of the pulse with a phase of a timing signal in synchronization with the reproduction purpose clock signal, and holding means for holding comparison results of comparisons by the comparing means of a predetermined number of times, and carrying out phase control of the reproduction clock generating means when the same comparison result is sequentially obtained the predetermined number of times.

According to the invention, the phase comparing means carries out the phase control of the reproduction clock generating means when the same comparison result continues the predetermined number of times, so that it is possible to further reduce the effect of the erroneous motion due to the noise or the like and to cut the period of the motion clock to about ½ of the pulse.

Additionally, according to the invention, phase control is made such that the reproduction clock signal is generated when the same result of a comparison between the pulse detected from the pulse signal to be demodulated according to the patterns expected in relation to the motion clock and timing of the reproduction clock signal has continued the predetermined number of times. Therefore, it is possible to make it less susceptible to the effect of the noise even if the frequency of the motion clock becomes low. In the case where it is unnecessary to make phase adjustment with a high precision, the value of the precision n may be made smaller to n=2. In other words, by using the motion clock having a period of ½ of the pulse width of the pulse existing in the pulse signal, the phase control of reproduction clock signal can be properly made.

The invention is characterized in that the reproduction clock generating means generates a timing signal which is changed in waveform in synchronization with the reproduction purpose clock signal, preceding a predetermined timing of change in waveform within the same period, and the phase comparing means carries out said comparison using the timing signal generated by the reproduction clock generating means.

According to the invention, the phase comparison between the timing signal and the pulse is carried out preceding timing for detecting the presence or absence of the pulse by the reproduction purpose clock signal, and accordingly, the phase control to the reproduction clock generating means can be effectively carried out.

According to the invention, the phase comparison can be carried out with appropriate timing.

Furthermore, the invention is characterized in that the motion clock generating means generates the motion clock signal as a rectangular wave of 50% duty ratio, and the pulse generating means carries out sampling of the pulse signal on each rising edge and falling edge of motion clock signals.

According to the invention, since the motion clock is a rectangular wave of 50% duty ratio, by sampling the pulse signals on the rising and falling edges, sampling can be performed in a period of ½ of the period of the motion clock.

According to the invention, since the duty ratio of the motion clock signal is 50%, sampling the pulse signal to be demodulated may be carried out on the rising and falling edges, so that a constitution of the pulse detecting means can be simplified.

Furthermore, the invention is characterized in that the pulse detecting means includes:

a flip-flop with a plurality of stages for sampling the pulse signals on each rising edge and falling edge of motion clock signals; and a logic circuit for comparing an output of the flip-flop with the plurality of stages, with the expected plurality of patterns.

Furthermore, the invention is characterized in that the logic circuit judges whether the phase of the reproduction purpose clock signal generated from the reproduction clock generating means is in advance of or delayed from the information pulse in the pulse signal, and outputs a signal to show a judgement result, and the phase comparing means judges whether timing of the information pulse detected by the pulse detecting means is in a predetermined locked state or not to the reproduction purpose clock signal, and when judging that the timing is not in the locked state, the phase comparing means carries out phase control of the reproduction clock generating means on the basis of the judgment result from said logic circuit.

Furthermore, the invention is characterized in that the logic circuit includes a memory in which results of comparison with the plurality of patterns are preset as data for reading out the output of the flip-flop with the plurality of stages as an address signal.

Furthermore, the invention is characterized in that the pulse signal is modulated by PPM.

According to the invention, in demodulating the PPM pulse signal containing only one pulse for a plurality of pulse slots, it is possible to easily generate the reproduction clock signal synchronized with the pulse.

Furthermore, according to the invention it is possible to reduce the frequency of the motion clock necessary for demodulating the PPM pulse signal, and to achieve reduction of power consumption and erroneous motion due to noise.

BRIEF DESCRIPTION OF THE DRAWINGS

Other and further objects, features, and advantages of the invention will be more explicit from the following detailed description taken with reference to the drawings wherein:

FIGS. 8A and 8B are time charts showing a lead recovery process in case unlocking is detected in the lead mode of the embodiment of FIG. 4;

FIGS. 13A through 13C are timing charts of the PPM demodulating apparatus of FIG. 12;

DETAILED DESCRIPTION OF THE PREFERRED EMBODIMENTS

Figure 1:
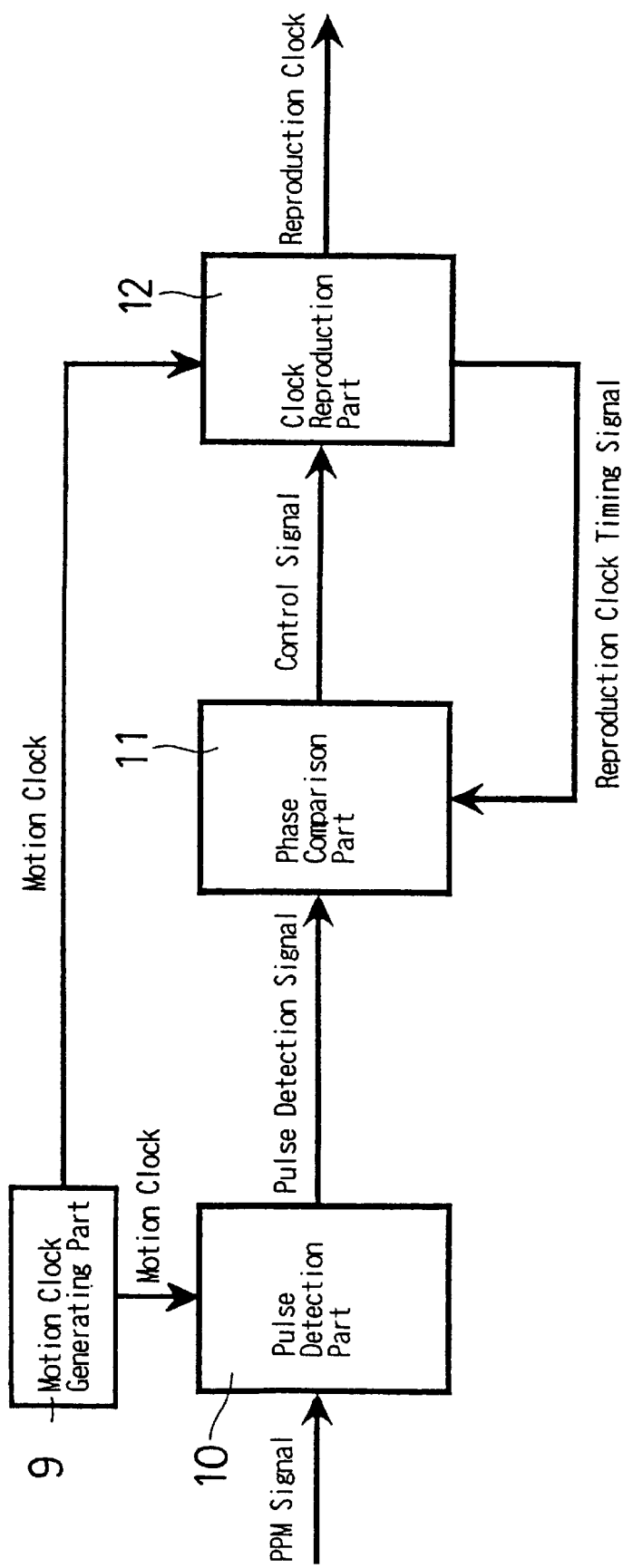
FIG. 1 is a block diagram showing a schematic constitution of an embodiment of the invention.

Now referring to the drawings, preferred embodiments of the invention are described below.

FIG. 1 shows a schematic electrical constitution of an embodiment of the invention. A motion clock generating part 9 generates a motion clock signal so as to obtain precision n, i.e., so as to obtain a pulse width of a pulse signal to be demodulated n times as long as a period of the motion clock signal, based on a master clock of equipment provided with a PLL apparatus for demodulating the pulse signal, or the like. A pulse detection part 10 samples the pulse signal based on a motion clock supplied from the motion clock generating part 9 or a clock obtained by dividing it. When sampling is continuously carried out a plural number of times, if the pulse width is within a range of a certain magnification to a period of the motion clock signal, a result of sampling matches with any of the expected patterns as described later. When a pulse matching with any one of the patterns has been detected, the pulse detection part 10 provides a phase comparison part 11 with said pulse as a pulse detection signal. The phase comparison part 11 performs a phase comparison between a reproduction clock timing signal synchronized with a reproduction clock signal generated in a clock reproduction part 12 and the pulse detection signal. The phase comparison part 11 controls a phase of the clock reproduction part 12 according to a result of the phase comparison.

Figure 2:
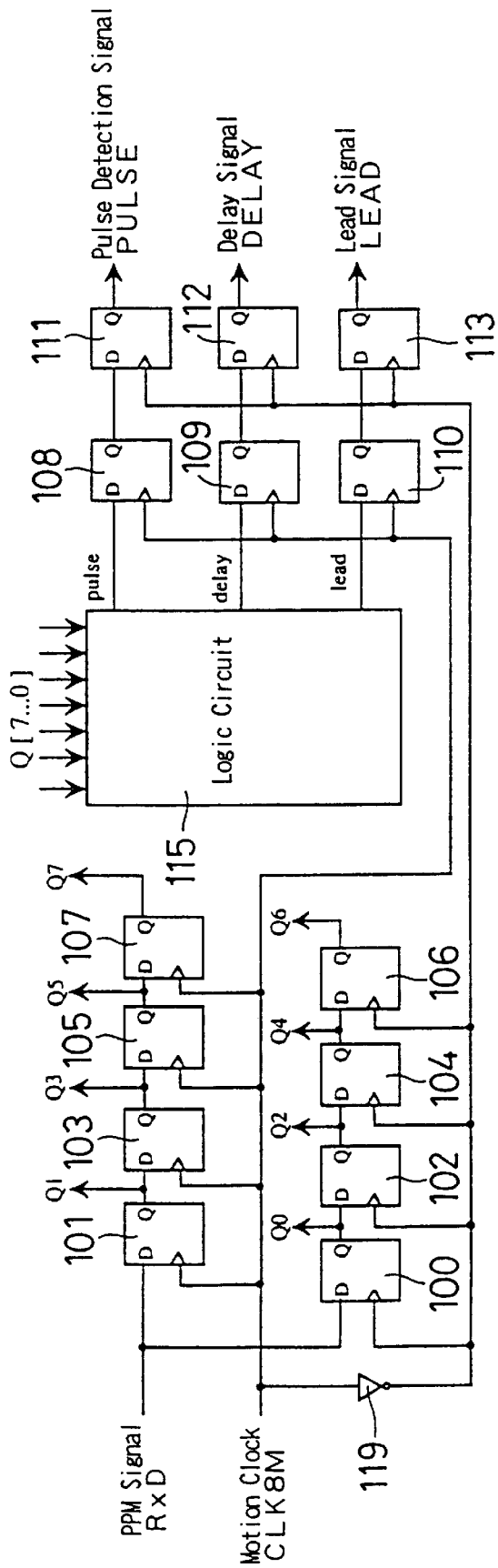
FIG. 2 is a block diagram showing a logical constitution of a pulse detection part 10 of FIG. 1.

FIG. 2 shows a concrete constitutional example of the pulse detection part 10 of FIG. 1. A PPM pulse signal RxD to be demodulated is sampled according to a motion clock CLK8M. For sampling, D flip-flops (hereafter to be abbreviated as "DFF") 100–107 are used. DFFs 108–113 are used to generate a pulse detection signal PULSE, a delay signal DELAY and a lead signal LEAD from a result of a pattern comparison by a logic circuit 115 based on outputs Q0–Q7 of DFFs 100–107. Of the DFFs 100–107, the DFFs 101, 103, 105, and 107 take in data inputs D on a rising edge of the motion clock CLK8M. The DFFs 100, 102, 104 and 106 take in the data inputs D on the rising edge of the motion clock CLK8M given through an inverter 119, i.e., on a falling edge of the original motion clock CLK8M. The DFFs 108, 109, and 110 take in the data inputs on the rising edge of the motion clock CLK8M, and the DFFs 111, 112 and 113 take in the data inputs D on the falling edge of the motion clock CLK8M.

The PPM pulse signal RxD to be demodulated is given to the data input D of DFF 100, 101. Outputs pulse, delay and lead of the logic circuit 115 are given to the data inputs D of DFFs 108, 109 and 110, respectively. The data inputs D of DFFs 103, 105 and 107 are connected to outputs Q of DFFs 101, 103 and 105, respectively. The data inputs D of DFFs 102, 104 and 106 are connected to the outputs Q of DFFs 100, 102 and 104, respectively. The data inputs D of DFFs 111, 112 and 113 are connected to the outputs Q of DFFs 108, 109 and 110, respectively. The logic circuit 115 changes the three outputs of pulse, delay and lead according to the eight input data of Q0–Q7 which represent the outputs of DFFs 100–107, respectively. The logic circuit 115 may be constituted as a ROM in which the outputs Q0–Q7 of DFFs 100–107 are taken as address signals.

Figure 3:
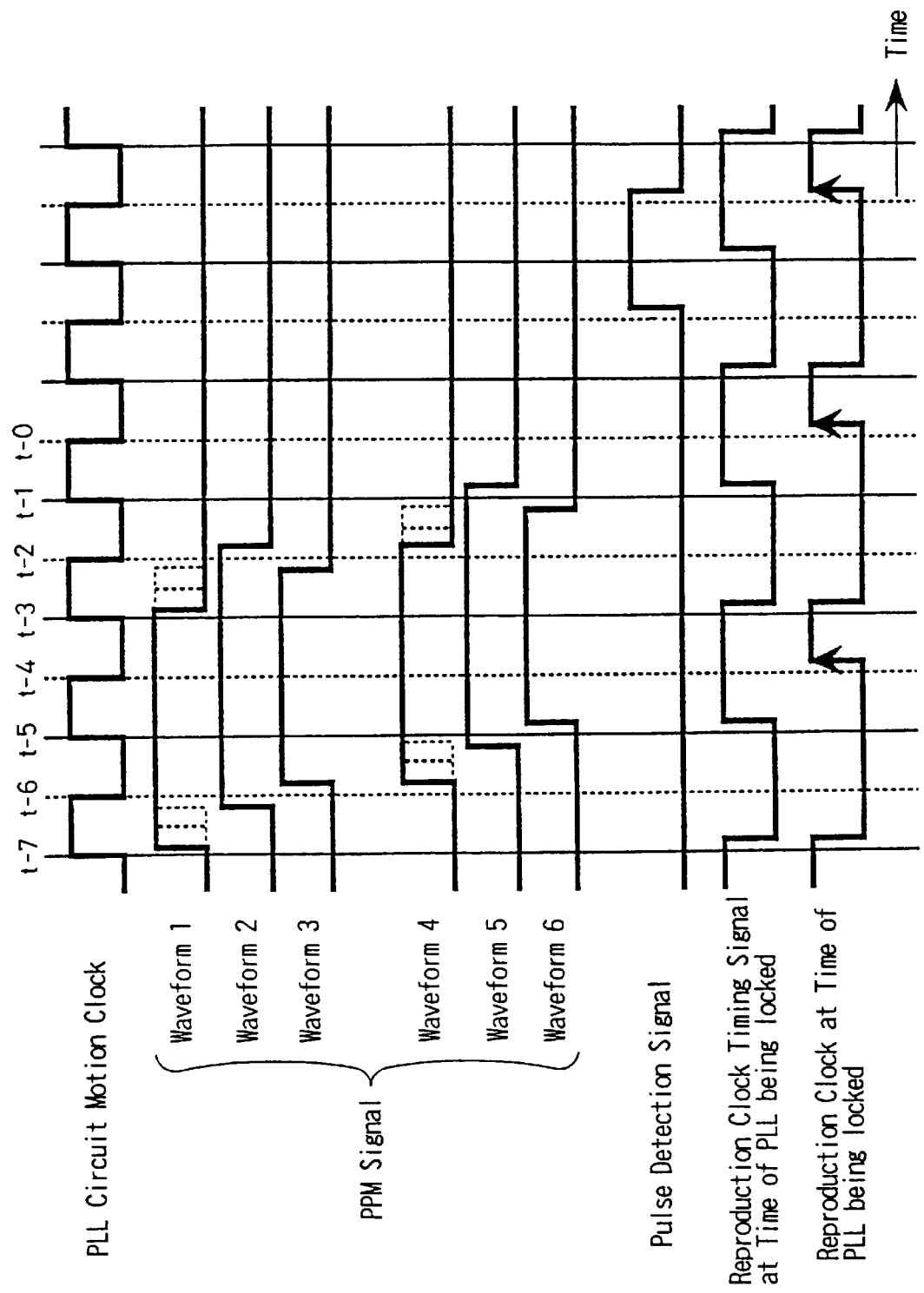
FIG. 3 is a time chart showing a motion of the pulse detection part 10 of FIG. 2.

FIG. 3 shows a phase relationship between the PPM pulse signal detected by the pulse detection part 10 of FIG. 2 and the motion clock, and phase relationships between various signals of FIG. 1 with respect to a case of the precision n=2. Considering the relative phase of the pulse in the PPM signal to be demodulated on the basis of the motion clock, there can be no other selection than six kinds as shown in waveforms 1–6, wherein it is assumed that fluctuations of the pulse width of the motion clock falls within ±⅕ of a reference pulse width. The waveform 1 and the waveform 4 show cases where the pulse width of the pulse in the pulse signal to be demodulated corresponds to two periods of the motion clock. In the waveform 1, the pulse rises between the rising edge and the falling edge of the motion clock. In the waveform 4, the pulse rises between the falling edge and the next rising edge of the motion clock. The waveforms 2 and 5 show cases where the pulse width of the pulse in the PPM pulse signal is longer than double the period of the motion clock. In the waveform 2, the pulse rises between the rising edge and the falling edge of the motion clock, and in the waveform 5, the waveform rises between the falling edge and the next rising edge of the motion clock. The waveform 3 and the waveform 6 show cases where the pulse width of the pulse in the PPM pulse is smaller than double the period of the motion clock period. In the waveform 3, the pulse rises between the falling edge and the next rising edge of the motion clock, and in the waveform 6, the pulse rises between the rising edge in some period of the motion clock and the falling edge in the next period of the motion clock at which the pulses of the waveforms 1–5 have rose up.

The logic circuit 115 of FIG. 2 compares the outputs Q0–Q7 of DFFs 100–107 with the expected patterns at a time t0 of FIG. 3 corresponding with the waveforms 1–6 of the PPM pulse signal shown in FIG. 3. It is estimated from the waveforms 1–6 as shown in FIG. 3 that patterns shown in the following Table 1 will be obtained immediately after the time t0. At the time t0, the PPM pulse signal is latched to DFF 100, and the PPM pulse signals at times t-1–t-7 which precede the time to by half the period of the motion clock are latched in DFFs 101–107, respectively. Consequently, signal levels at the times t-7–t0 correspond to the outputs Q7–Q0, respectively.

| Wave form | Q7 | Q6 | Q5 | Q4 | Q3 | Q2 | Q1 | Q1 | pulse | delay | lead |
|---|---|---|---|---|---|---|---|---|---|---|---|
| 1 | 0 | 1 | 1 | 1 | 1 | 0 | 0 | 0 | | | |
| 2 | 0 | 1 | 1 | 1 | 1 | 1 | 0 | 0 | 1 | 1 | 0 |
| 3 | 0 | 0 | 1 | 1 | 1 | 0 | 0 | 0 | | | |
| 4 | 0 | 0 | 1 | 1 | 1 | 1 | 0 | 0 | | | |
| 5 | 0 | 0 | 1 | 1 | 1 | 1 | 1 | 0 | 1 | 0 | 1 |
| 6 | 0 | 0 | 0 | 1 | 1 | 1 | 0 | 0 | | | |
| Other Combinations | | | | | | | | | 0 | 0 | 0 |

The pulse detection part 10 detects, simultaneously with the pulse detection, whether the phase of the reproduction clock signal is delayed or advanced against the pulse signal. FIG. 3 shows a phase relationship between the reproduction clock signal and reproduction clock timing against the pulse signal in a state which the PLL is locked. The reproduction clock timing signal is generated in synchronization with the reproduction clock signal, wherein the falling edge of the reproduction clock timing signal matches with that of the reproduction clock signal, but the rising edge thereof precedes that of the reproduction clock signal. Since the reproduction clock signal needs to be generated so as to sample the pulse signal based on the motion clock, timing in which the reproduction clock signal rises just once when the pulse exists in the pulse signal must be kept at all times.

When central parts between the rising edges and falling edges of the waveforms 1–6 of FIG. 3 are taken as references, it is found that the rise of the reproduction clock signal is apt to lag the waveforms 1–3 and lead the waveforms 4–6. Accordingly, logic of the signal delay to represent a delay and logic of the signal lead to represent a lead are determined as in Table 1. Namely, when the pattern corresponds to one of the waveforms 1 to 3, the delay is 1 and the lead is 0, and when the pattern corresponds to one of the waveforms 4 to 6, the delay is 0 and the lead is 1. In case of pattern not coming under the waveforms 1 to 6, all the three outputs pulse, delay and lead are zero.

In the pulse detection signal of FIG. 3, when the reproduction clock timing signal is sampled on its rising edge, the sampling result is zero. When the pulse signal comes to the left side of the waveform 1, the pulse detection signal shifts to the left by one period of the motion clock, and therefore the result of sampling the reproduction clock timing signal on the rising edge of the pulse detection signal becomes 1. To the contrary, when the pulse signal comes to the right side of the waveform 6, the pulse detection signal also shifts to the right by one period of the motion clock, so that the result of sampling the reproduction clock timing signal on the rising edge becomes 1. Consequently, it is possible to inspect whether the PLL is unlocked or not according to the result of sampling the reproduction clock timing signal on the rising edge of the pulse detection signal. The phase comparison part 11 of FIG. 1 is basically realized by a DFF which gives the reproduction clock timing signal to the data input D, and the pulse detection signal to a clock input. When there is a delicate positional relationship in which the PLL may be unlocked or not, the sampling result may be 0 or 1. Accordingly, it is desirable to constitute the phase comparison part 11 so as to judge the PLL to be unlocked only when the sampling result has been 1 continuously about 5 times, and to output a control signal on judgment of unlocking. It is further desirable that the phase comparison part 11 gives a control signal equal to a delay recovery process completion signal and a lead recovery process completion signal described later to the clock reproduction part 12.

The pulse detection part 10 detects the pulse based on the patterns from the results of sampling the PPM pulse signals a plural number of times by the motion clock or the signal obtained by dividing it. Accordingly, a majority part of noise carried on the PPM pulse signal does not appear as the pulse detection signal of the output. The phase comparison part 11 checks a phase shift by making a phase comparison between the pulse detection signal and the reproduction clock timing signal. As the reproduction clock timing signal, a signal having a phase relationship with the reproduction clock signal as shown in FIG. 3 is generated in the clock reproduction part 12, but the reproduction clock signal may be used as such. The phase comparison part 11 carries out control for delaying or advancing the reproduction clock signal by outputting the control signals for phase delay control or phase lead control to the clock reproduction part 12 according to the result of phase comparison.

Although a conventional PLL employs the motion clock having a frequency as sufficiently high as eight times or more to the pulse width To (8×fo=8/To and above) because of a likelihood of erroneous motion due to noise, in the present embodiment it is possible to deem that the pulse detection signal does not carry noise because of presence of the pulse detection part 10, and it is possible to lower the frequency of the motion clock of a PLL circuit to the two-fold frequency.

Figure 4:
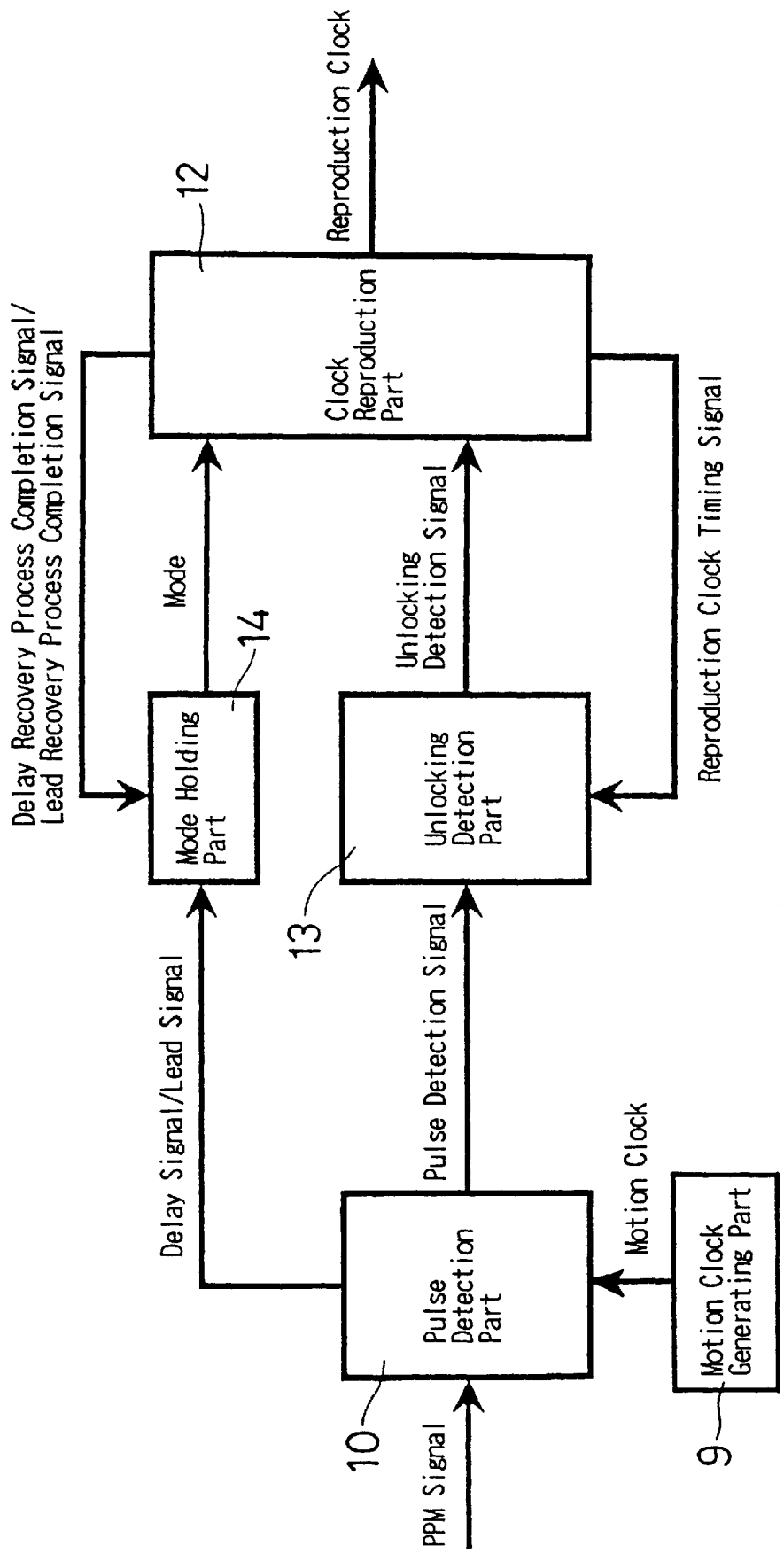
FIG. 4 is a block diagram showing a schematic constitution of another embodiment of the invention.

FIG. 4 shows a schematic constitution of the other embodiment of the invention. The pulse detection part 10 of this embodiment gives the pulse detection signal to an unlocking detection part 13, and gives the delay signal or lead signal to a mode holding part 14. Though the judgment of delay or lead is made by the pulse detection part 10 to each pulse contained in the PPM pulse signal to be demodulated, in case the pulse signal to be demodulated contains Jitter and the like, information on the individual judgments is devoid of reliability. However, in case the delay signal is for example detected 5 continuous times, the information can be considered probably correct. The mode holding part 14 switches a delay mode when for example the delay signal is given continuously for 5 times, and inversely, switches to a lead mode when the lead signal is given 5 continuous times. In a case other than that, the mode is held as it is. Accordingly, even if unlocking occurs, immediately following it, the mode holding part 14 continues to hold the mode immediately before occurrence of unlocking.

Assuming, for example, that the mode holding part 14 holds the "delay mode" immediately after the unlocking, it is found that the unlocking has occurred because the phase of the reproduction clock signal had excessively lagged behind the pulse signal. In this case, the clock reproduction part 12 carries out a delay recovery process for advancing the reproduction clock signal. Inversely, in case of the mode holding part 14 having held the "lead mode" immediately after the unlocking, a lead recovery process is performed to delay the reproduction clock signal. In case the information that the clock reproduction part 12 has performed the delay recovery process or lead recovery process is useful for the mode judgment, the clock reproduction part 12 sends a delay recovery process completion signal or lead recovery process completion signal to the mode holding part 14.

By providing the mode holding part 14 together with the pulse detection part 10, information on whether the phase of the PLL motion clock leads or lags the pulse signal can be held at all times, and a value of PLL precision n can be reduced to n=2. That is to say, even if the frequency of the PLL circuit motion clock is lowered to 2×fo (Hz), it becomes possible to make a judgment of delay or lead.

Figure 5:
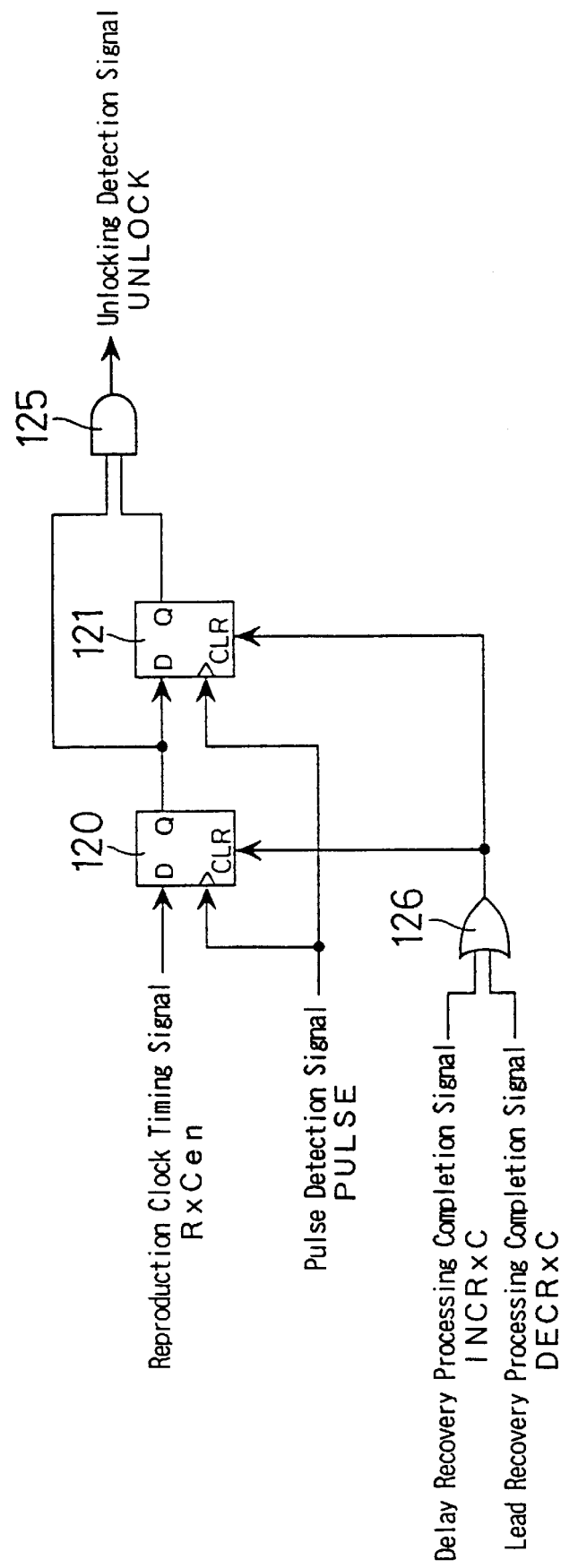
FIG. 5 is a block diagram showing a logical constitution of an unlocking detection part 13 of FIG. 4.

FIG. 5 shows a constitution of the unlocking detection part 13 of FIG. 4. The reproduction clock timing signal RxCen from the clock reproduction part 12 is inputted to a data input D of a DFF 120. An output Q of the DFF 120 is given to a data input D of a DFF 121. The pulse detection signals from the pulse detection part 10 are given to clock inputs of the DFFs 120 and 121, and the data inputs D are taken in on their rising edges. When both the outputs Q of the DFF 120 and DFF 121 are 1, the unlocking detection signal UNLOCK which is an output of AND circuit 124 becomes 1. The unlocking detection part 13 of FIG. 4 gives the unlocking detection signal to the clock reproduction part 12. From the clock reproduction part 12, the delay recovery process completion signal INCRxC and the lead recovery process completion signal DECRxC are given, and their logics are given to clear inputs CLR of DFFs 120 and 121 through the OR circuit 126. In other words, when the reproduction clock timing signal becomes 1 continuously two times at the rise of the pulse detection signal shown in FIG. 3, the unlocking detection signal also becomes 1, and when the delay recovery process completion signal or lead recovery process signal is outputted, the unlocking detection signal becomes 0. As described above, although it is desirable that the judgment on unlocking is made only when the result of sampling about five continuous times has become 1, the DFFs 120 and 121 are shown in two stages for convenience of illustration. In case of making detection five sequential times, the DFF may be formed in 5 stages and an input number in the AND circuit may be set to 5.

Figure 6:
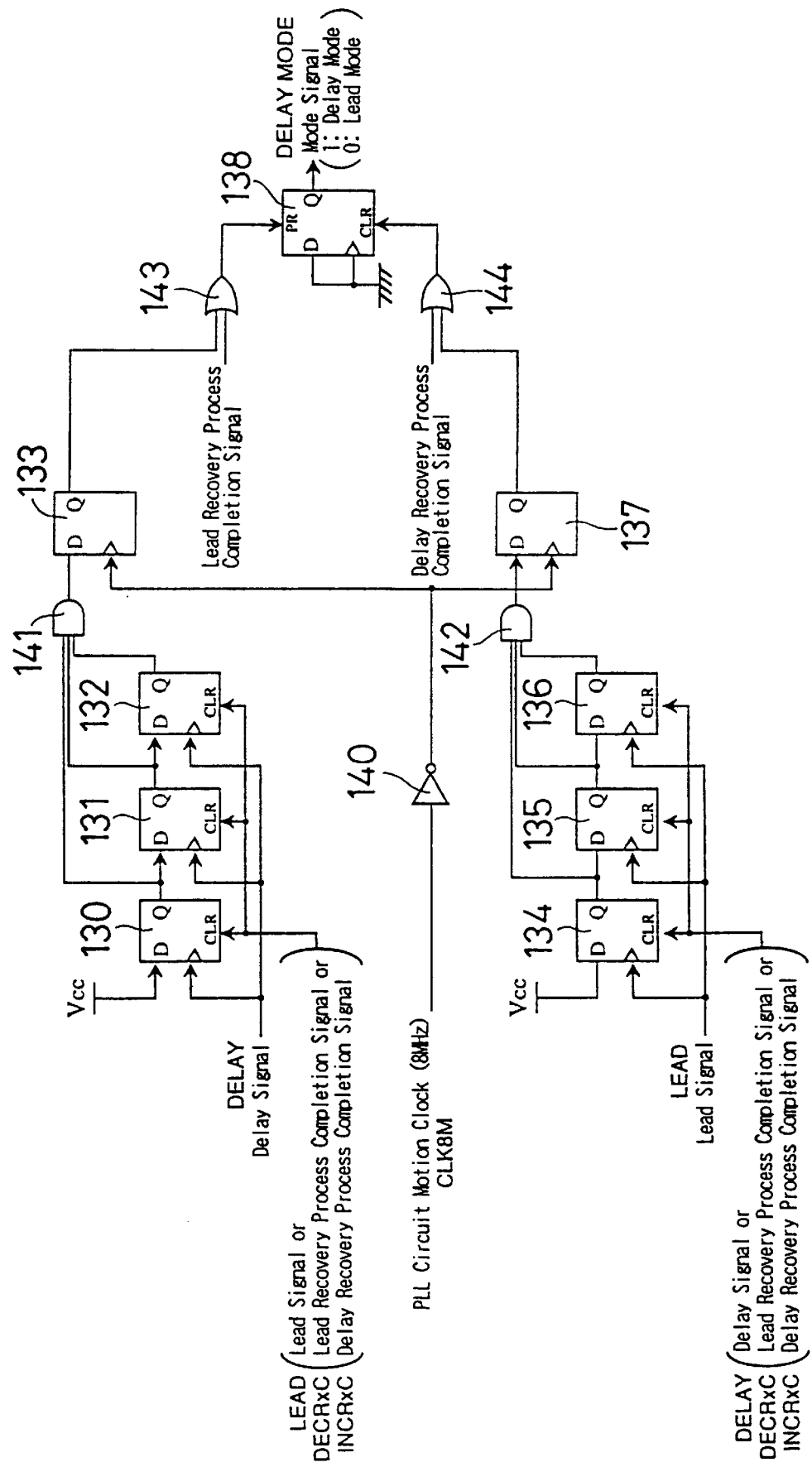
FIG. 6 is a block diagram showing a logical constitution of a mode holding part 14 of FIG. 4.

FIG. 6 shows a constitution of the mode holding part 14 of FIG. 4. DFFs 130, 131, and 132 generate outputs of Q=1 sequentially on the rising edge of the delay signal DELAY. The clear inputs CLR of DFFs 130, 131 and 132 are provided with the inputs in which the outputs Q are cleared to 0 when any of the lead signal LEAD, the lead recovery process completion signal DECRxC and the delay recovery process completion signal INCRxC becomes 1. A DFF 133 takes in 1 as the data input D when all the outputs Q of the three DFFs 130, 131 and 132 are 1 on the falling edge of the motion clock CLK8M. DFFs 134, 135 and 136 similarly give 1 to a data input D of a DFF 137 in synchronization with the falling edge of the motion clock CLK8M when the lead signal LEAD is detected three continuous times. The clear inputs CLR of DFFs 134, 135 and 136 are provided with inputs to clear the output when any one of the delay signal DELAY, the lead recovery process completion signal DECRxC and the delay recovery process completion signal INCRxC becomes 1. A DFF 138 is set when an output Q of DFF 133 becomes 1 or when the lead recovery process completion signal becomes 1, and it is cleared when an output of the DFF 137 becomes 1 or the delay recovery process completion signal becomes 1. That is to say, an output Q of the DFF 138 generates a signal to show the delay mode when the mode signal DELAY MODE is 1, and a signal to show the lead mode when the same is 0.

Clock inputs of DFFs 133 and 137 are provided with the motion clock CLK8M through an inverter circuit 140. A data input D of DFF 133 is provided with the outputs Q of DFFs 130, 131 and 132 through an AND circuit 141 for the three inputs. A data input D of DFF 137 is provided with outputs Q of DFFs 134, 135 and 136 through an AND circuit 142 for the three inputs. A preset input PR of DFF 138 is provided with the output 0 of DFF 133 and the lead recovery process completion signal through an OR circuit 143 for the two inputs. A clear input CLR of DFF 138 is provided with the output Q of DFF 137 and the delay recovery process completion signal through an input OR circuit 144 for the two inputs.

The mode holding part 14 shown in FIG. 6 holds the mode signal DELAY MODE as 1 showing the "delay mode" in case it detects the delay signal DELAY from the pulse detection part 10 continuously three times. Inversely, in case of detection of the lead signal LEAD three continuous times, it holds the mode signal DELAY MODE as 0 showing the "lead mode".

Figure 7A:
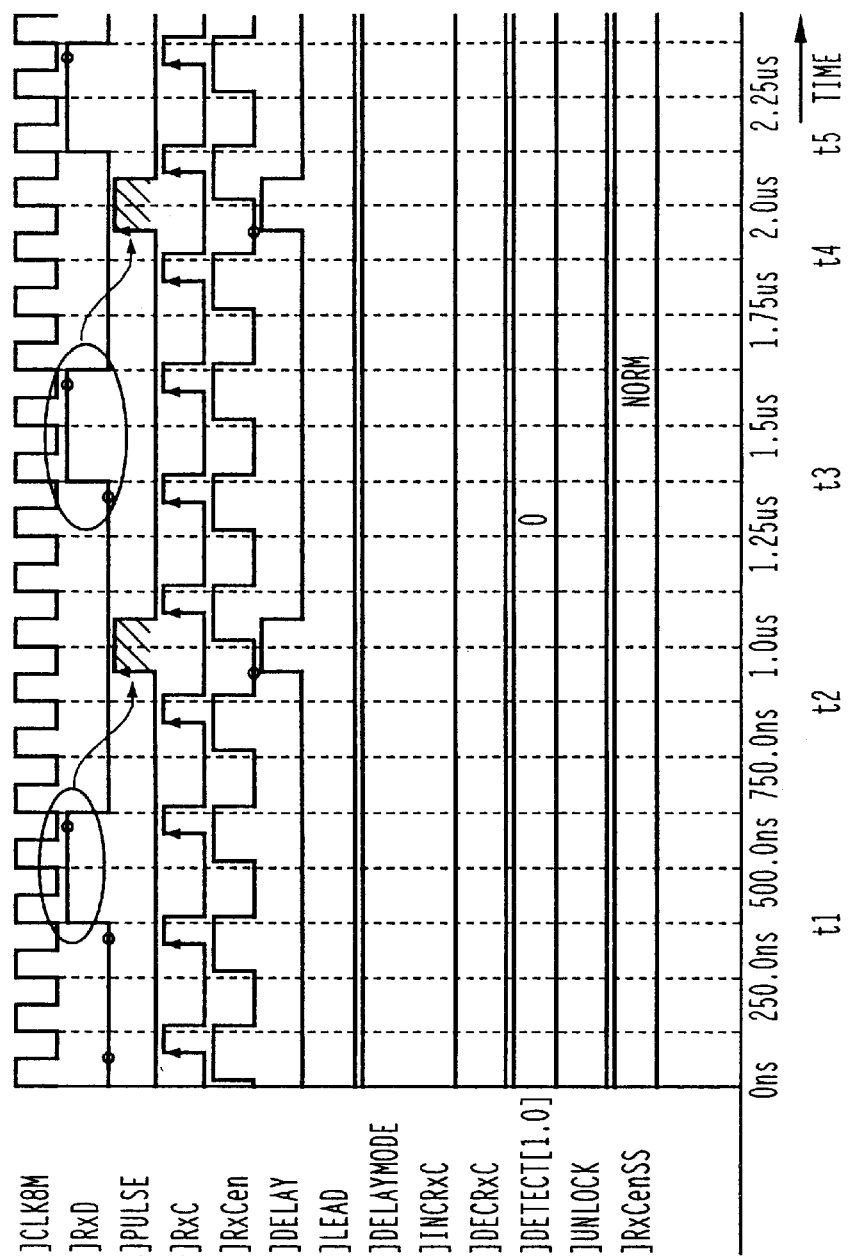
FIGS. 7A and 7B are time charts showing a delay recovery process in case unlocking is detected in a delay mode of the embodiment of FIG. 4.
Figure 7B:
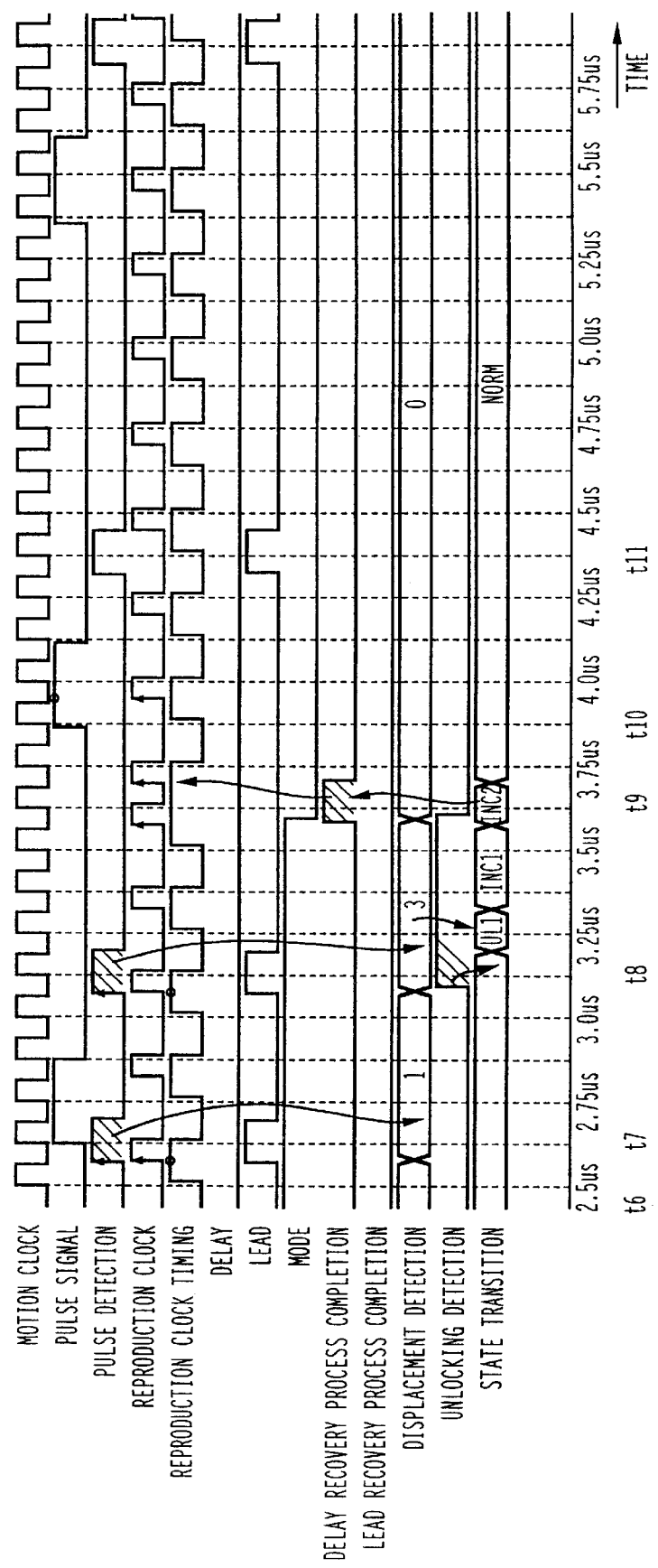

FIGS. 7A and 7B show an example of a timing chart for delay recovery process in case the unlocking is detected at a time of the "delay mode" as shown in FIG. 6. A state transition will be described later in FIG. 10. Such condition occurs when the PPM pulse signal shifts to the left side of the waveforms 1–3 in FIG. 3. Namely, to the PPM pulse signals from times t1, t3, and t5, the pulse detection signals are formed from times t2, t4, and t6, respectively. Since the reproduction clock timing reaches a high level at a time t6 and it does at a time t8 for detecting the pulse signal from a time t7 as well, the unlocking is detected. In this case, the clock generating part 12 carries out the delay recovery process for advancing the phase of the reproduction clock signal by 180 degrees at a time t9. Because an amount of the phase to be advanced by the delay recovery process is large at 180 degrees, as shown in the pulse detection signal from a time t11 to the pulse signal from a time t10, the mode immediately after this process always becomes the lead mode. This can be confirmed from the timing chart. Accordingly, the clock reproduction part 12 outputs the delay recovery process completion signal INCRxC to the mode holding part 14 immediately after performing the delay recovery process, and the mode holding part 14 which received this signal clears the DFFs 130–136, then clears and rewrites the DFF 138 so that the mode signal can become 0 showing the "lead mode".

Figure 8A:
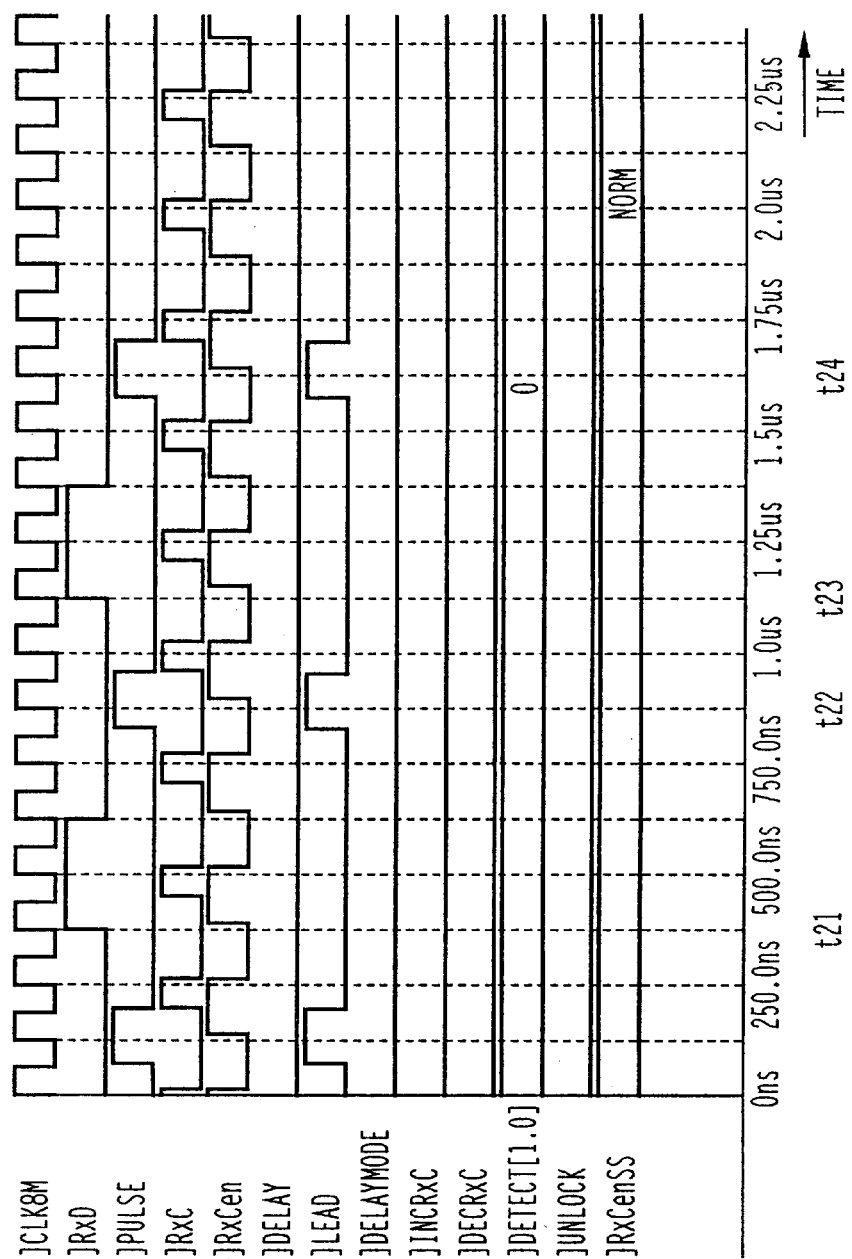

FIGS. 8A and 8B show an example of a timing chart for the lead recovery process in case where the unlocking is detected at a time of the "lead mode". Such case occurs due to a shift of the PPM pulse signal of FIG. 3 to right side of the waveforms 4–6. Namely, to the PPM pulse signal from times t21, t23, and t25, the pulse detection signal is formed from times t22, t24, and t26. Because the reproduction clock timing reaches a high level at a time t26 and it does at a time t28 for detecting the pulse signal from a time t27 as well, the unlocking is detected. In this case, the clock reproduction part 12 performs the lead recovery process to delay the phase of the reproduction clock signal by 180 degrees by a time t30. Since the mode immediately after the lead recovery process always becomes the delay mode, as shown in the pulse detection signal from a time t31 to the pulse signal from a time t29, the clock reproduction part 12 outputs the lead recovery process completion signal to the mode holding part 14. The mode processing part 14 which has received this signal clears the inside DFFs 130–136 and rewrites them so as to be in a position showing the mode signal "delay mode" from the output Q of DFF 138.

Figure 9:
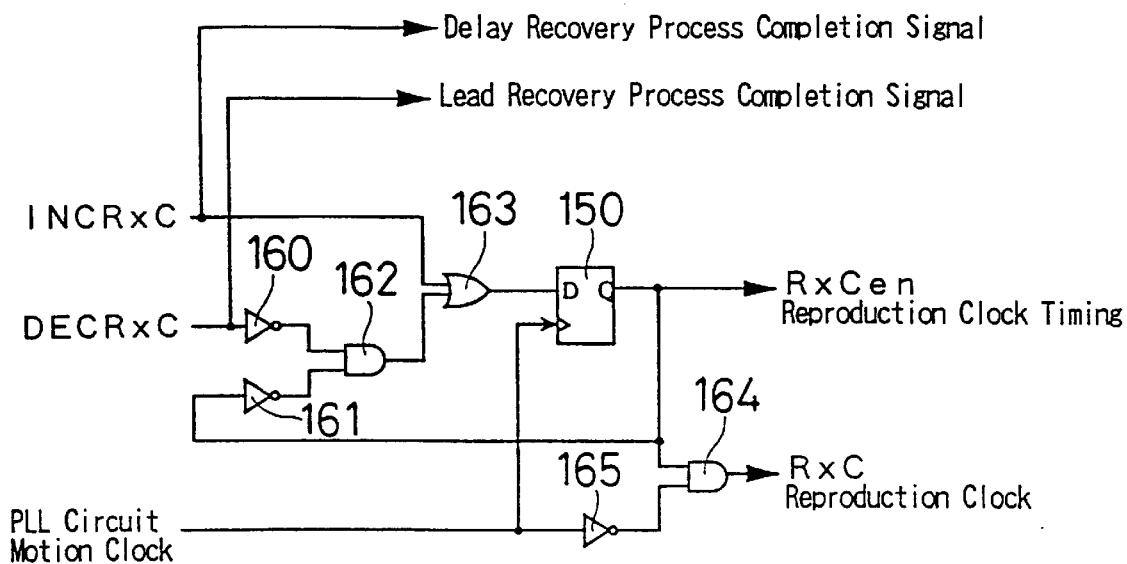
FIG. 9 is a block diagram showing a logical constitution of a clock reproduction part 12 of the embodiment of FIG. 4.

FIG. 9 shows a constitution of the clock reproduction part 12 of FIG. 4. The clock reproduction part 12 of the embodiment of FIG. 1 also can basically have the similar constitution. The clock reproduction part 12 is a state machine, and it carries out the state transition in synchronization with the falling edge of the motion clock. A DFF 150 which takes in the data input D on the rising edge of the motion clock and outputs the reproduction clock timing signal RxCen from its output Q. The lead recovery process completion signal DECRxC and the reproduction clock timing signal are inputted to an AND circuit 162 through inverter circuits 160, 161, and an output showing its logic product and the delay recovery process completion signal INCRxC are inputted to an OR circuit 163. An output of the OR circuit 163 is given to an input D of DFF 150. An AND circuit 164 for generating the reproduction clock signal RxC is provided with the motion clock as an input through an inverter circuit 165, and also the reproduction clock timing signal as an input, and a logic product is outputted.

Figure 10:
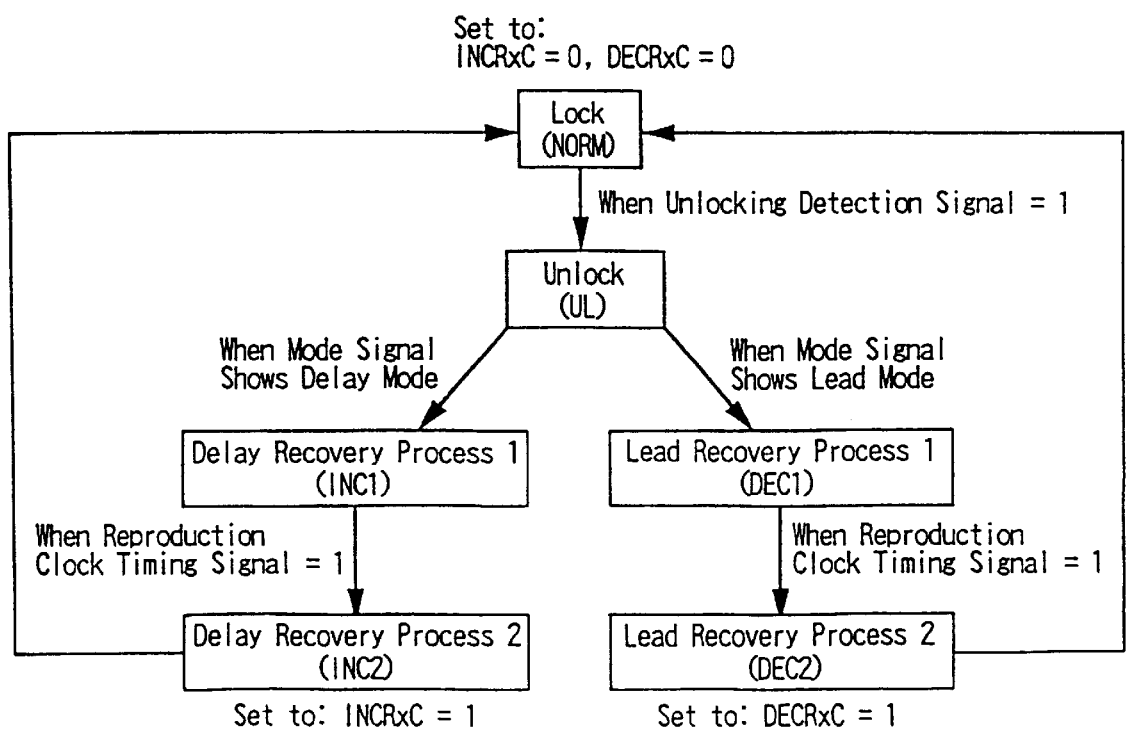
FIG. 10 is a diagram of state transition of the clock reproduction part 12 of FIG. 9.
Figure 11A:
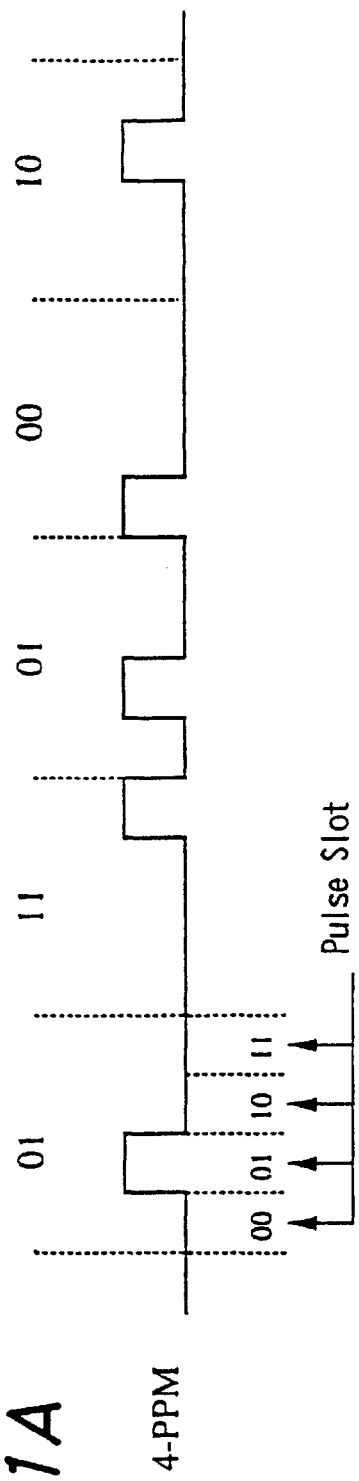
FIGS. 11A and 11B are diagrams of waveforms of a PPM signal.
Figure 11B:
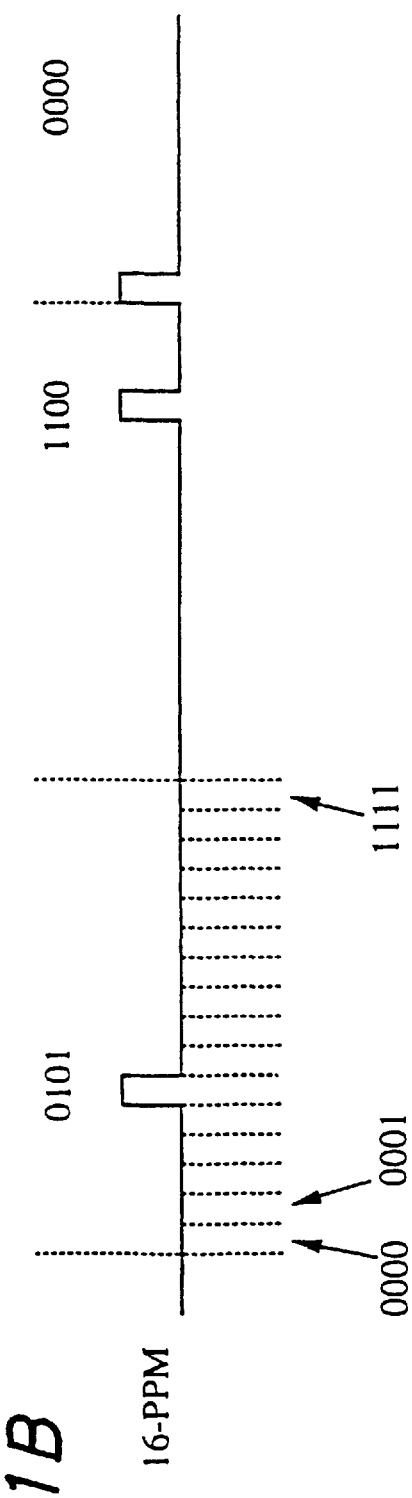
Figure 12:
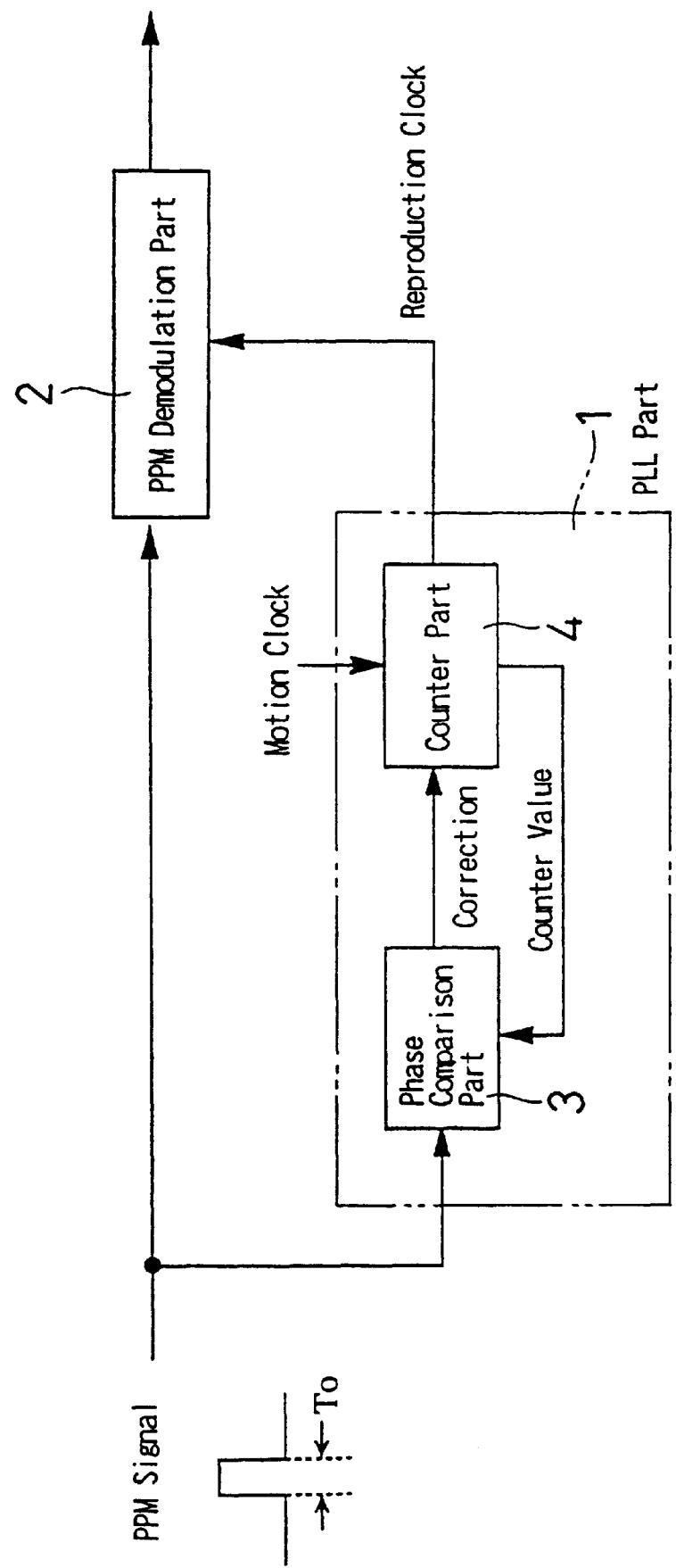
FIG. 12 is a block diagram showing a constitution of a conventional PPM signal demodulating apparatus.

FIG. 10 shows a state transition diagram corresponding to the clock reproduction part 12 as the state machine. In case the unlocking is detected at a time of an excessive delay, the delay recovery process completion signal INCRxC becomes 1 only for one clock time, and as a result, the reproduction clock signal is advanced only by one clock time. Inversely, when the unlocking is detected at a time of an excessive lead, the lead recovery process completion signal DECRxC becomes 1 only for one clock time, and as a result the reproduction clock signal is delayed only by one clock time. In the state machine of FIG. 10, the state transition is carried out on the basis of the motion clock obtained by inverting the motion clock of PLL circuit by the inverter circuit 165.

With respect to the pulse signals of various embodiments as described above, the PPM signals may be efficiently detected. When a bit rate is elevated, the PPM signal requires the higher frequency of the necessary motion clock. Therefore, if the frequency of the motion clock can be lowered by applying this embodiment, then improvement of communications speed in optical communications and the like can be expected. However, concepts of the present invention are applicable to an extensive range besides the demodulation of the PPM pulse signal. For example, the invention is applicable to a VFO for reading data recorded by MFM system from a magnetic disk.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed in:

1. A phase locked loop apparatus for demodulating a pulse signal, which transmits information depending on whether an information pulse having a pulse width within a certain range is present or not, the apparatus periodically generating a reproduction clock signal with a reference pulse width to demodulate the pulse signal and controlling a phase of the reproduction clock signal to detect whether the information pulse is present or not in the pulse signal at a predetermined timing of change in waveform of the reproduction clock signal, the apparatus comprising:

motion clock generating means for generating a motion clock signal having a predetermined period of two or more natural numbers corresponding to the reference pulse width;

pulse detecting means for comparing a result of sampling of the pulse signal to be demodulated, based on the motion clock signal from said motion clock generating means, with a plurality of patterns expected based on fluctuations in pulse width of the information pulse in the pulse signal and fluctuations in phase of the information pulse in the pulse signal and the motion clock signal, to detect whether the information pulse is present or not, according to presence or absence of any pattern matching with the sampling result;

reproduction clock generating means for generating the reproduction clock signal; and phase comparing means for comparing the phase of the information pulse in the pulse signal which is used by said pulse detecting means as being present in the pulse signal with that of the reproduction clock signal generated from said reproduction clock generating means, and carrying out phase control of said reproduction clock generating means according to a comparison result.

2. The phase locked loop apparatus for demodulating a pulse signal of claim 1, wherein said phase comparing means comprises:

comparing means for comparing the phase of the information pulse with a phase of a timing signal in synchronization with the reproduction clock signal; and holding means for holding comparison results of comparisons by said comparing means of a predetermined number of times, and carrying out phase control of said reproduction clock generating means when a same comparison result is sequentially obtained the predetermined number of times.

3. The phase locked loop apparatus for demodulating a pulse signal of claim 2, wherein said reproduction clock generating means generates the timing signal having a waveform which is changed in synchronization with the reproduction clock signal, preceding a predetermined timing of change in the waveform within a same period, said phase comparing means carrying out the comparison using the timing signal generated by said reproduction clock generating means.

4. The phase locked loop apparatus for demodulating a pulse signal of claim 1, wherein said motion clock generating means generates the motion clock signal as a rectangular wave of 50% duty ratio, said pulse detecting means carries out sampling of the pulse signal at each rising edge and falling edge of the motion clock signal.

5. The phase locked loop apparatus for demodulating a pulse signal of claim 4, wherein said pulse detecting means comprises:

a flip-flop with a plurality of stages for sampling the pulse signal at each rising edge and falling edge of the motion clock signal; and a logic circuit for comparing outputs of the plurality of stages of said flip-flop with the plurality of patterns expected.

6. The phase locked loop apparatus for demodulating a pulse signal of claim 5, wherein said logic circuit judges whether the phase of the reproduction clock signal generated from said reproduction clock generating means is in advance of or delayed from the information pulse in the pulse signal, and outputs a signal indicative of a judgement result said phase comparing means judging whether timing of the information pulse detected by said pulse detecting means is in a predetermined locked state or not to the reproduction clock signal, and upon judging that the timing of the information pulse is not in the predetermined locked state, said phase comparing means carrying out phase control of said reproduction clock generating means based on the judgment result from said logic circuit.

7. The phase locked loop apparatus for demodulating a pulse signal of claim 5, wherein said logic circuit includes a memory in which results of comparisons with the plurality of patterns expected are preset as data for reading out wherein the outputs of the plurality of stages of said flip-flop are used as an address signal.

8. The phase locked loop apparatus for demodulating a pulse signal of claim 1, wherein the pulse signal is modulated by pulse position modulation.

9. A method of demodulating a pulse signal which includes information depending on whether an information pulse having a pulse width within a certain range is present or not, a reproduction clock signal with a reference pulse width being periodically generated to demodulate the pulse signal and a phase of the reproduction clock signal being controlled to detect whether the information pulse is present or not in the pulse signal at a predetermined timing of change in waveform of the reproduction clock signal, the method comprising the steps of:

a) generating a motion clock signal having a predetermined period of two or more natural numbers corresponding to the reference pulse width;

b) sampling the pulse signal to be demodulated on the basis of the motion clock signal;

c) comparing the sampled pulse signal with a plurality of patterns expected based on fluctuations in pulse width of the information pulse in the pulse signal and fluctuations in phase of the information pulse in the pulse signal and the motion clock signal, to detect whether the information pulse is present or not, according to presence or absence of any pattern matching with the sampled pulse signal;

d) comparing the phase of the information pulse in the pulse signal determined to be present in the pulse signal in said step c) with that of the reproduction clock signal; and e) controlling phase of the reproduction clock signal generated according to the comparison of said step d).

10. The method of demodulating a pulse signal of claim 9, wherein the motion clock generated in said step a) is a rectangular wave of 50% duty ratio, said step b) comprising sampling the pulse signal at each rising edge and falling edge of the motion clock signal.

11. The method of demodulating a pulse signal of claim 10, wherein said step b) comprises sampling the pulse signal at a plurality of stages at each rising edge and falling edge of the motion clock signal, said step c) comprising comparing samples of the pulse signal at the plurality of stages with the plurality of patterns expected.

12. The method of demodulating a pulse signal of claim 11, wherein said step c) comprises judging whether the phase of the reproduction clock signal is in advance of or delayed from the information pulse in the pulse signal and outputting a signal indicative of a judgement result, said step d) comprising judging whether timing of the information pulse detected in said step c) is in a predetermined locked state or not to the reproduction clock signal, and upon judging that the timing is not in the locked state, controlling phase of the reproduction clock signal generated based on the judgment result.

13. The method of demodulating a pulse signal of claim 11, wherein results of comparisons with the plurality of patterns expected in said step c) are preset as data for reading out wherein the samples of the pulse signal at the plurality of stages are used as an address signal.

14. The method of demodulating a pulse signal of claim 9, wherein said step d) comprises:

d1) comparing the phase of the information pulse with a phase of a timing signal in synchronization with the reproduction clock signal;

d2) holding comparison results of comparisons of said step d1) a predetermined number of times; and d3) controlling phase of the reproduction clock signal when a same comparison result is sequentially obtained the predetermined number of times.

15. The method of demodulating a pulse signal of claim 14, wherein said step d1) comprises comparing the phase of the information pulse using the timing signal, the timing signal having a waveform which is changed in synchronization with the reproduction clock signal, preceding a predetermined timing of change in the waveform within a same period.

16. The method of demodulating a pulse signal of claim 9, wherein the pulse signal is modulated by pulse position modulation.

* * * * *